US009786480B2

(12) United States Patent
Schanen

(10) Patent No.: US 9,786,480 B2
(45) Date of Patent: Oct. 10, 2017

(54) ANALYTICAL APPARATUS UTILIZING ELECTRON IMPACT IONIZATION

(71) Applicant: Markes International Limited, Llantrisant (GB)

(72) Inventor: Pierre Schanen, Gilching (DE)

(73) Assignee: MARKES INTERNATIONAL LIMITED, Llantrisant (GB)

( * ) Notice: Subject to any disclaimer, the term of this patent is extended or adjusted under 35 U.S.C. 154(b) by 0 days.

(21) Appl. No.: 15/231,383

(22) Filed: Aug. 8, 2016

(65) Prior Publication Data

US 2016/0343560 A1 Nov. 24, 2016

Related U.S. Application Data

(62) Division of application No. 14/767,920, filed as application No. PCT/GB2014/050486 on Feb. 19, 2014, now Pat. No. 9,524,858.

(30) Foreign Application Priority Data

Feb. 19, 2013 (GB) .................................. 1302818.8

(51) Int. Cl.
*H01J 27/20* (2006.01)
*H01J 37/08* (2006.01)
(Continued)

(52) U.S. Cl.
CPC .......... *H01J 49/147* (2013.01); *H01J 27/205* (2013.01); *H01J 49/0027* (2013.01); *H01J 49/40* (2013.01)

(58) Field of Classification Search
USPC ... 250/281, 282, 286, 287, 288, 292, 423 R, 250/424; 315/111.21, 111.41, 111.81
See application file for complete search history.

(56) References Cited

U.S. PATENT DOCUMENTS 5,294,797 A * 3/1994 Frey ...................... H01J 49/147 250/286
5,374,828 A * 12/1994 Boumsellek ............ H01J 49/08 250/288

(Continued)

FOREIGN PATENT DOCUMENTS

JP H02121233 A 5/1990
WO 2005003717 A2 1/2005

OTHER PUBLICATIONS

"Wehnelt Cylinder," Wikipedia, Apr. 11, 2012, http://en.wikipedia.org/w/index.php?title=Wehnelt_cylinder&oldid=486823106.

(Continued)

*Primary Examiner* — Bernard Souw
(74) *Attorney, Agent, or Firm* — Troutman Sanders, LLP; Ryan A. Schneider

(57) ABSTRACT

An analytical apparatus for mass spectrometry comprises an electron impact ionizer including an electron emitter and an ionization target zone. The target zone is arranged to be populated with matter to be ionized for analysis. An electron extracting element is aligned with an electron pathway defined between the electron emitter and the ionization target zone. The electron extracting element is configured to accelerate electrons away from the emitter along the electron pathway between the emitter and the extracting element and to decelerate the electrons along the electron pathway between the extracting element and the ionization target zone to enable soft ionization while avoiding the effects of Coulombic repulsion at the electron source.

21 Claims, 8 Drawing Sheets

(51) Int. Cl.

| | |
|---|---|
| ***H01J 49/14*** | (2006.01) |
| ***H01J 49/00*** | (2006.01) |
| *H01J 49/40* | (2006.01) |

(56) References Cited

U.S. PATENT DOCUMENTS

| | | | | |
|---|---|---|---|---|
| 5,387,843 | A | 2/1995 | Nagayama et al. | |
| 6,919,562 | B1 * | 7/2005 | Whitehouse | H01J 49/147 250/288 |
| 7,462,821 | B2 * | 12/2008 | Barket, Jr. | H01J 49/0031 250/281 |
| 9,524,858 | B2 * | 12/2016 | Schanen | H01J 49/147 |
| 2004/0000647 | A1 | 1/2004 | Horsky | |
| 2004/0104682 | A1 * | 6/2004 | Horsky | H01J 27/205 315/111.81 |
| 2005/0051096 | A1 * | 3/2005 | Horsky | C23C 14/48 118/723 CB |
| 2005/0184735 | A1 | 8/2005 | Arnold et al. | |
| 2006/0234901 | A1 * | 10/2006 | Scheuing | C11D 1/004 510/475 |
| 2007/0194252 | A1 * | 8/2007 | Horsky | H01J 37/08 250/492.21 |
| 2015/0380228 | A1 * | 12/2015 | Schanen | H01J 49/147 250/281 |

OTHER PUBLICATIONS

International Search Report in related PCT Application No. PCT/GB2014/050486, mailed Oct. 27, 2014.

Search Report in related GB Application No. GB1302818.8, mailed Aug. 19, 2013.

* cited by examiner

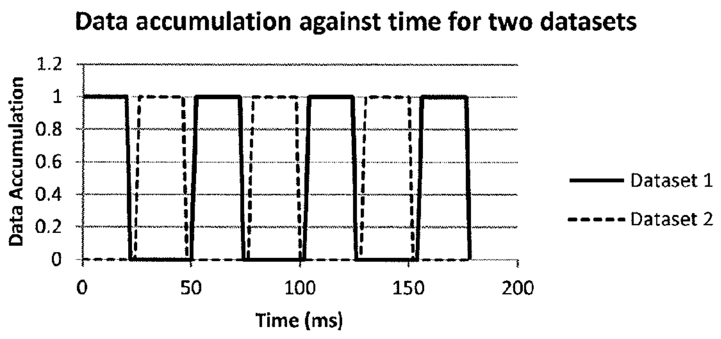
Fig. 8: Data accumulation against time for scan rate of 50Hz. Each scanset comprises 200 scans and is recorded every 20ms. Solid line = 1st data set acquired at 1st ionisation voltage and dashed line = 2nd data set set.

ANALYTICAL APPARATUS UTILIZING ELECTRON IMPACT IONIZATION

CROSS-REFERENCE TO RELATED APPLICATIONS

This application is a divisional of U.S. patent application Ser. No. 14/767,920, filed 14 Aug. 2015, which is a US National Stage of International Application No. PCT/GB2014/050486, filed 19 Feb. 2014, which claims the benefit of GB 1302818.8, filed 19 Feb. 2013, the contents of which are hereby incorporated by reference herein in their entireties.

BACKGROUND OF THE INVENTION

1. Field of the Invention

The present invention relates to an analytical apparatus and in particular a mass spectrometry system including an electron impact ionizer.

2. Description of Related Art

Mass spectrometry (MS) is a commonly used analytical technique for determining the mass of particles. MS can also be used to determine the elemental composition of a sample or molecule by analyzing its constituent parts, and to provide an insight into the chemical structures of molecules, for example complex hydrocarbon chains. A mass spectrometer determines the mass of a particle by measuring its mass-to-charge ratio. This method requires the particles to be charged, and a mass spectrometer therefore operates by ionizing samples in an ion source to generate charged molecules and/or molecular fragments and then measuring the mass-to-charge ratios of these ions.

Uncharged particles (neutrals) cannot be accelerated by an electric field. It is therefore necessary that all particles to be analyzed by mass spectrometry are ionized. A typical ionization technique is electron ionization (EI), also referred to as electron impact ionization, in which a source of gas phase neutral atoms or molecules is bombarded by electrons. The electrons are normally generated through thermionic emission in which an electric current is passed through a wire filament to heat the wire causing the release of energetic electrons. The electrons are then accelerated towards the ion source using a potential difference between the filament and the ion source.

EI is a routinely used technique usually intended for the analysis of low-mass, volatile, thermally stable organic compounds. EI is normally performed at an electron energy value of 70 eV as this presents high ionization efficiency and an analytical means of standardization across different MS instruments offering this ionization technique. However, at an electron energy of 70 eV the energy transferred from the accelerated electrons to the sample molecules during ionization impact is sufficient to break bonds within the analyte molecule causing it to 'fragment' into several smaller ions. Ordinarily this is desirable, since the energy deposition causing molecular fragmentation is reproducibly standardized such that the pattern of fragment ions, the 'mass spectrum' of a given analyte, is sufficiently similar on different instruments to yield an analytical fingerprint for the analyte. The level of fragmentation is such that, for many chemical classes of analytes, the original molecule (or 'molecular ion') often cannot be seen or is very small. For this reason EI is known as a 'hard' ionization technique.

For mixtures of analytes, a hyphenating analytical technique such as gas chromatography (GC) is often interfaced to the mass spectrometer, enabling highly complex mixtures of analytes to be separated in time and sequentially admitted to the ion source. But even with analytical hyphenation, the complexity of the sample may be overwhelming and cause many superimposed mass spectra to be generated which cannot be unraveled and collectively defy analytical discrimination. Therefore it is often desirable to reduce the degree of fragmentation by reducing the energy of the electron ionization. However, if the electron energy is lowered by reducing the electron acceleration voltage a marked decrease in ion production is experienced in part due to a decrease in the concentration of electrons in the ion source as the electrical field is insufficient to accelerate significant numbers of electrons away from the filament in a concentrated path, and in part to a reduced ionization efficiency at electron energies below 70 eV. The latter effect is shown in FIG. 1, which charts ionization probability vs. electron energy for some example molecules. A peak is displayed at around 70 eV and the sensitivity below 70 eV decreases sharply until a level is reached, typically at around 15 eV, where the results are usually not analytically useful.

By increasing the current of the electron emission filament, the population of electrons generated will increase and the ion flux may also increase, leading to some improvement in sensitivity at lowered electron energies. However, at large filament currents the high densities of electrons close to the filament causes Coulombic repulsion (called Space Charge Limited Emission, also known as Child-Langmuir Law in the case of planar geometry), where the repulsive forces between the high density electrons proximal to the filament itself prevent further electrons from being released. This results in an electron flux plateau. Furthermore, in regions of high electron density around the filament, the electrons which have been released are also repelled from one another. This results in a broadening of the electron beam which can reduce the accuracy with which the electrons are focused into the ion source and therefore the level of ionization. This issue is amplified when the electrons have lower kinetic energy due to a lower applied potential difference, as their momentum in the direction of the ion source is decreased. As such, increased filament current may only provide a limited improvement in ionization efficiency.

Chemical ionization is a known 'soft' ionization technique. Chemical ionization requires the use of large quantities of a reagent gas such as methane and the ionization energy is dependent on the reagent gas used. Therefore the ionization energy is not easily adjustable. Standardization of spectra can also be difficult with this method due to a shortage of libraries to search.

A number of alternative soft ionization techniques have been applied to GC/MS measurements. These include resonance-enhanced multi photon ionization (REMPI) and the more universal single photon ionization (SPI). These soft ionization methods cause little or no fragmentation of the molecular ion which have been applied to sources in GC/MS instruments. Another soft ionization technique uses the cooling of the molecules in a supersonic molecular beam (SMB). A SMB is formed by the expansion of a gas through a pinhole into a vacuum chamber resulting in the cooling of the internal vibrational degrees of freedom. SMB is used as an interface between a GC and an MS and combined with electron impact ionization lead to enhanced molecular ion signals and can therefore be regarded as a soft ionization method.

Such 'soft' ionization techniques provide soft ionization only and cannot be utilized to also provide harder ionization if such is required. US2009/0218482 describes a system which provides both hard and soft ionization using electron pulses to create hard electron ionization of the analyte molecules and photon pulses to provide soft photo ionization. These two techniques are implemented simultaneously with the electron ionization being repeatedly switched 'on' and 'off' in a pulsed manner to switch between the soft and hard ionizations. However, the hardware requirements for such a system are significant with both electron and photon generation means being required together with the associated delivery and focusing set up for each technique. The cost of such a dual system is therefore prohibitive and the amount and size of equipment required to implement both ionization techniques significantly increase the space required for such a system.

It is therefore desirable to provide an improved ionization apparatus and method for the ionization of an analyte sample which addresses the above described problems and/or which offers improvements generally.

BRIEF SUMMARY OF THE INVENTION

According to the present invention there is provided an electron ionization apparatus as described in the accompanying claims. There is also provided a mass spectrometer with an ionization apparatus as defined by the accompanying claims.

In an embodiment of the invention there is provided an electron impact ionization apparatus comprising an electron emitter; an ionization target zone arranged to be populated with sample matter to be ionized and an electron extractor arranged between the electron emitter and the ionization target zone comprising an electrically conductive element to which a voltage is applied such that the potential difference between the electron emitter and the electron extractor is greater than the potential difference between the electron emitter and the ionization target zone. The extractor functions as an accelerator drawing electrons away from the electron emitter to prevent Coulombic repulsion limiting electron emission. The enhanced acceleration field with an extractor allows a higher electron flux from the emitter as compared to the acceleration field between emitter and target zone alone. The energy of the electrons in the target zone will however not be changed by the extractor as this energy is defined by the potential difference between the electron emitter and the ionization target zone. As a consequence of this the electrons will be decelerated between extractor and target zone. In this way, 'soft' electron ionization may be achieved without loss of sensitivity due to the maintenance of high electron density at the ionization target zone.

The electron extractor consists of a plate or grid. The electron extractor plate is preferably arranged substantially perpendicular to the electron pathway.

Apart from extracting the electrons the extractor may also be used to modulate or stop the electron beam by applying different, preferentially negative voltages, during different time intervals.

The electron ionization apparatus may further comprise an electron reflector arranged to repel electrons emitted from the electron emitter substantially in the direction of the ionization target zone. The electron reflector may be an electrically chargeable element configured to be negatively charged and is provided on the opposing side of the electron generator to the ionization target zone such that when negatively charged the reflector repels electrons in the direction of the ionization target zone to cause ionization of material therein. The electron reflector combines with the ionization target zone to create a positive potential difference in the direction of the ionization target zone to drive electrons in the direction of the target zone.

Apart from reflecting the electrons towards the target zone the electron reflector may also be used to modulate or stop the electron beam by applying different, preferentially positive voltages, during different time intervals.

The electron ionization apparatus may further comprise an electron focusing element aligned with the electron pathway and located between the electron emitter and the ionization target zone which is arranged to focus and direct the electrons towards the target zone. The electron focusing element may be electrically chargeable and configured to be negatively charged. By focusing the electrons from the electron emitter along an electron pathway to the ionization target zone the electron density incident at the ionization target zone is increased and hence the ionization efficiency is correspondingly increased.

An electron pathway is preferably defined between the electron emitter and the ionization target zone and the electron focusing element comprises a focusing aperture which is aligned with the electron pathway. In this way the electrons are focused through the aperture towards the target zone. The electron focusing element may comprise an electrically conductive plate having the focusing aperture extending therethrough. The electron focusing element may be situated between emitter and extractor or between extractor and target zone.

Apart from focusing the electrons the focusing element may also be used to modulate or stop the electron beam by applying different, preferentially negative voltages, during different time intervals.

In a preferred configuration the electron focusing element is placed in proximity of the electron emitter or surrounds it partially. Placing the focusing element in proximity or surrounding the emitter with a portion of the focusing element minimizes lateral drift of electrons from the point of emission and maximizes the number of electrons directed along the electron pathway.

The electron focusing element may comprise a main body section and an extension section extending from the surface of the main body section in the direction of the electron emitter, the extension section defining an enclosure having one open end near or surrounding the electron emitter and the other open end contiguous with the aperture of the main body section. Preferably the main body and the extension section define a top-hat configuration with the extension section near or surrounding the emitter. The top-hat configuration is advantageous where space surrounding the emitter is limited as it provides a reduced wall thickness in the area surrounding the emitter.

The electron emitter preferably comprises an electric filament configured to be heated to generate electrons through thermionic emission.

The electron ionization apparatus may further comprise a magnetic focusing element at both sides of the electron pathway generating a magnetic field between electron emitter and target zone such that the electron beam is focused and confined along the centre of the beam.

The electron ionization apparatus may further comprise an ionization chamber having an internal volume defining the ionization target zone, the chamber comprising an electron inlet aperture aligned with electron pathway arranged to permit entry of electrons emitted from the electron emitter into the ionization chamber, and a gas inlet configured to permit the flow of gas phase molecules into the chamber for ionization.

These and other objects, features and advantages of the present invention will become more apparent upon reading the following specification in conjunction with the accompanying drawing figures.

BRIEF DESCRIPTION OF THE DRAWINGS

FIG. 8 shows data accumulation against time for two data sets.

DETAIL DESCRIPTION OF THE INVENTION

Figure 1:
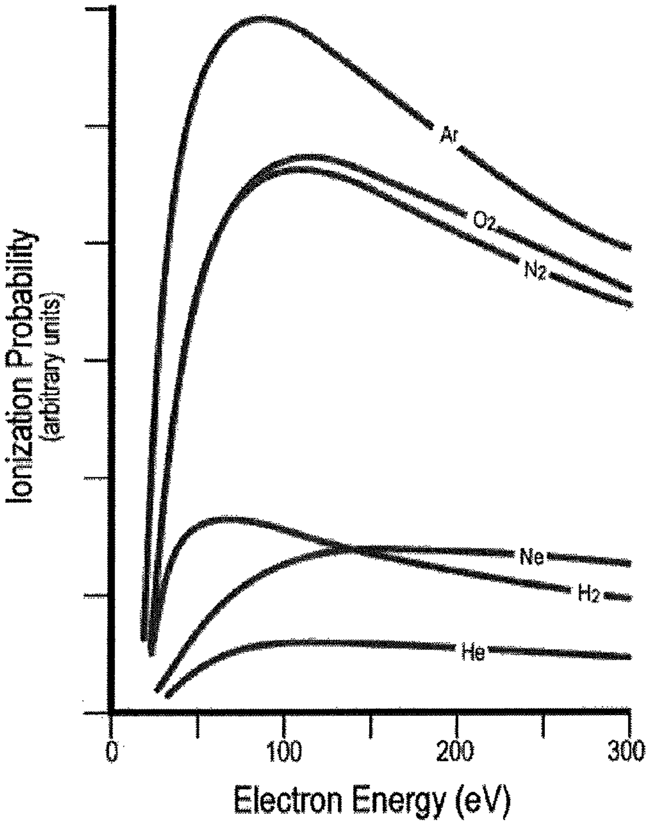
FIG. 1 is a graph showing the effect of electron energy on ionization efficiency.

To facilitate an understanding of the principles and features of the various embodiments of the invention, various illustrative embodiments are explained below. Although exemplary embodiments of the invention are explained in detail, it is to be understood that other embodiments are contemplated. Accordingly, it is not intended that the invention is limited in its scope to the details of construction and arrangement of components set forth in the following description or illustrated in the drawings. The invention is capable of other embodiments and of being practiced or carried out in various ways. Also, in describing the exemplary embodiments, specific terminology will be resorted to for the sake of clarity.

It must also be noted that, as used in the specification and the appended claims, the singular forms "a," "an" and "the" include plural references unless the context clearly dictates otherwise. For example, reference to a component is intended also to include composition of a plurality of components. References to a composition containing "a" constituent is intended to include other constituents in addition to the one named.

Also, in describing the exemplary embodiments, terminology will be resorted to for the sake of clarity. It is intended that each term contemplates its broadest meaning as understood by those skilled in the art and includes all technical equivalents which operate in a similar manner to accomplish a similar purpose.

Ranges may be expressed herein as from "about" or "approximately" or "substantially" one particular value and/ or to "about" or "approximately" or "substantially" another particular value. When such a range is expressed, other exemplary embodiments include from the one particular value and/or to the other particular value.

Similarly, as used herein, "substantially free" of something, or "substantially pure", and like characterizations, can include both being "at least substantially free" of something, or "at least substantially pure", and being "completely free" of something, or "completely pure".

By "comprising" or "containing" or "including" is meant that at least the named compound, element, particle, or method step is present in the composition or article or method, but does not exclude the presence of other compounds, materials, particles, method steps, even if the other such compounds, material, particles, method steps have the same function as what is named.

It is also to be understood that the mention of one or more method steps does not preclude the presence of additional method steps or intervening method steps between those steps expressly identified. Similarly, it is also to be understood that the mention of one or more components in a composition does not preclude the presence of additional components than those expressly identified.

The materials described as making up the various elements of the invention are intended to be illustrative and not restrictive. Many suitable materials that would perform the same or a similar function as the materials described herein are intended to be embraced within the scope of the invention. Such other materials not described herein can include, but are not limited to, for example, materials that are developed after the time of the development of the invention.

Figure 2:
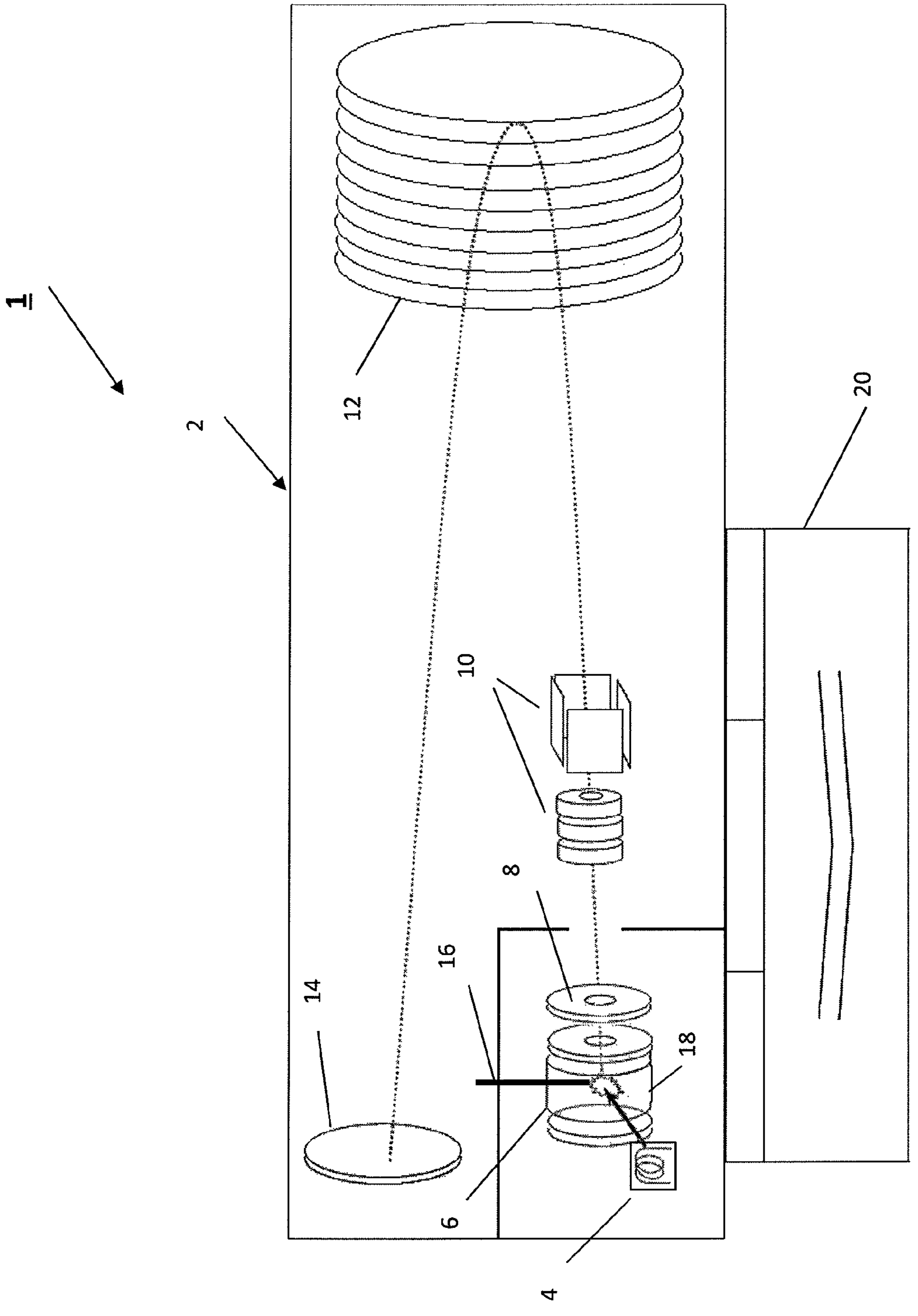
FIG. 2 shows a mass spectrometer with an electron ionization apparatus according to an embodiment of the present invention, the apparatus is symbolized as a box.

In the embodiment shown in FIG. 2 a TOF mass spectrometer is used to analyze the analyte molecules and the combination of this technique with the ionization system of the present invention is described by way of one example of the use of the system for analysis of analyte molecules. Referring to FIG. 2 a Time of Flight (TOF) mass spectrometer 1 comprises a vacuum chamber 2 pumped by a vacuum pump 20 and containing an electron generator 4, an ion source 6, accelerator plates 8, ion optics 10 a reflector 12 and a detector 14. An analyte is introduced to the TOF following initial chromatographic separation in a gas chromatograph (GC). The GC (not shown) is connected to the TOF 1 by a gas inlet line 16. The gas inlet line 16 is a heated transfer line and the analyte source flows from the GC column through the gas inlet 16 and into the ion source chamber 18. The analyte source comprises a gas flow containing molecules from the GC, the mass to charge ratio of which is to be determined by the TOF 1.

Figure 3:
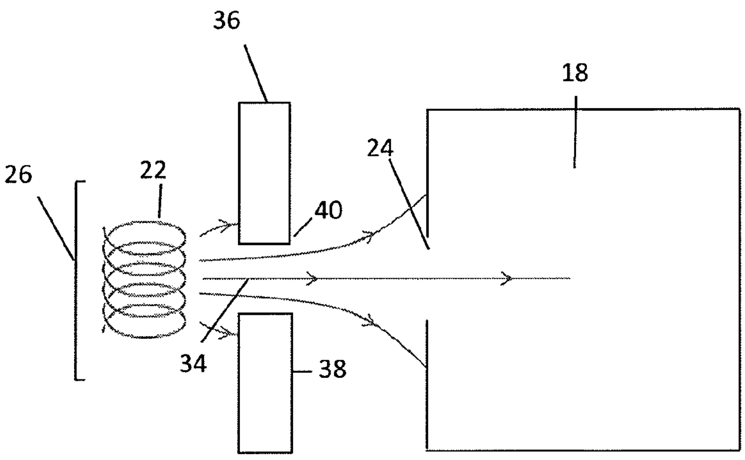
FIG. 3 shows a schematic representation of a first embodiment of the electron ionization apparatus of FIG. 2.

As shown in FIG. 3, the electron source 4 comprises a filament 22 connected to an electrical power source. The filament 22 is configured such that when an electrical current is passed through the filament, large quantities of electrons are produced and omitted from the filament 22 through thermionic emission. The filament 22 is located outside of the ion source chamber 18. The filament 22 is spaced from the source chamber 18 and aligned with an aperture 24 in the chamber 18 which is configured to permit electrons to pass into the source chamber 18.

In electron impact ionization systems of the prior art an accelerating voltage of 70V is used to accelerate the electrons towards the ion chamber with an energy of 70 eV. However it has been found that this accelerating voltage of 70V can result in over fragmentation of the analyte molecules making it difficult to distinguish between two or more simultaneously ionized substances due to interferences between their fragmentation patterns. Lowering the accelerating voltage to, for example, around 15V reduces the kinetic energy of the electron beam allowing for a "softer" ionization. This decreases the degree of fragmentation, allowing the molecular ions to become more prevalent. However, when using these lower accelerating voltages the ionization probability has been found to fall away sharply.

One reason for this is that the lower accelerating voltage is insufficient to pull a significant number of electrons away from the area of the filament, with large quantities of the electron cloud surrounding the filament drifting in directions away from the ion chamber due to Coulombic effects which gain in importance at lower acceleration voltages. The other reason is that further electron production from the filament is suppressed by Coulombic repulsion of the already existing electron cloud (space charge limited emission). As such, the electron density at the ion chamber 18 is reduced.

To counter this problem, an electron extractor, or extractor lens 36 is provided in close proximity to the filament 22 at a location between the filament 22 and the ion chamber 18. The term 'lens' is used as the extractor may provide a focusing function but this term is non-limiting and it is not essential that the extractor 36 focuses the electrons. The extractor 36 comprises a metallic plate 38 having a centrally located aperture 40. In an alternative embodiment the extractor may be a metallic grid or a frame with a metallic grid, or a plate having a plurality of apertures. The extractor 36 is arranged such that the plate or grid 38 is substantially perpendicular to the path of the electron beam 34 with the aperture or grid 40 being aligned with the path of the electron beam 34 such that electrons from the filament 22 travelling along the electron beam path 34 are permitted to pass through the aperture 40 and onwards to the ion chamber 18. The direct line of sight between the filament 22 and the opening 24 of the ion source chamber 18, comprising the shortest distance between the two, defines an electron beam path 34.

At a low acceleration voltage Coulombic effects around the filament 22 can lead to a condition where the density of electrons in the region of the filament 22 is sufficient to prevent the production of further electrons Therefore, in order to overcome the Coulombic repulsion of the electron cloud surrounding the filament the extractor 36 is charged to create a positive potential difference between the filament 22 and the extractor 36 that is greater than the potential difference between the filament 22 and the ion chamber 18. This larger potential difference acts to accelerate the electrons away from the filament 22 at a much higher rate than is achieved by the potential difference between the filament 22 and the ion chamber 18 alone, thereby reducing the electron density in the region of the filament 22, preventing Coulombic repulsion from inhibiting electron emission and hence maximizing the electron production from the filament.

Once the electrons have passed through the aperture 40 of the extractor 36 their momentum decreases as they are decelerated back to the energy corresponding to the potential difference between filament 22 and ion chamber 18.

Preferably the potential difference between the filament 22 and the ion chamber 18 is selected to be in the range of 5-30 V thereby resulting in electron energies at the ion chamber in the range of 5-30 eV. Below this range the electron energy is too low to cause ionization of the analyte molecules, whereas above this range fragmentation begins to occur. A yet more preferable range has been identified as being 5-25 V with an electron energy range of 5-25 eV, and more preferably again the system is operated at an electron energy of 14 eV.

A reflecting plate 26 can be mounted behind the filament 22 on the opposing side of the filament 22 from the source chamber 18 such that the filament 22 is located between the source chamber 18 and the reflecting plate 26. The reflecting plate 26 is negatively charged such that the negatively charged electrons are repelled away from the reflecting plate 26 in the general direction of the ion source chamber 18. It is contemplated that in an alternative embodiment the apparatus may function without a reflecting plate, which is possible due to the extraction force applied by the extractor 36. The reflector can however provide increased efficiency by reducing electron losses in a direction away from the electron pathway.

The electron beam 34 and gas inlet 16 to the ion chamber 18 are arranged such that the electron beam 34 enters the ion source chamber 18 substantially perpendicular to the flow of analyte into the ion chamber 18 from the gas inlet 16.

Within the ion source chamber 18 the energetic electrons interact with the gas phase analyte molecules to produce ions. When the electrons are passing in close proximity to the analyte molecules energy is transferred from the electrons to the analyte molecules causing ionization of the molecule. This method is known as electron ionization (0). In the situation where fragmentation occurs, the level of fragmentation depends on the amount of energy transferred from the electron to the analyte molecule, which is in turn dependent on the energy of the incoming electrons. Therefore, by reducing the energy of the incoming electrons to a lower level, the fragmentation of the analyte is significantly reduced resulting in a larger concentration of unfragmented molecular ions.

Once the ions have been generated within the ion source chamber 18, which may be any suitable volume within which ions are generated for onward analysis, ions are ejected and then onwardly processed depending on the analysis technique to be used. In the embodiment shown in FIG. 2 a TOF mass spectrometer is used to analyze the analyte molecules.

Figure 4:
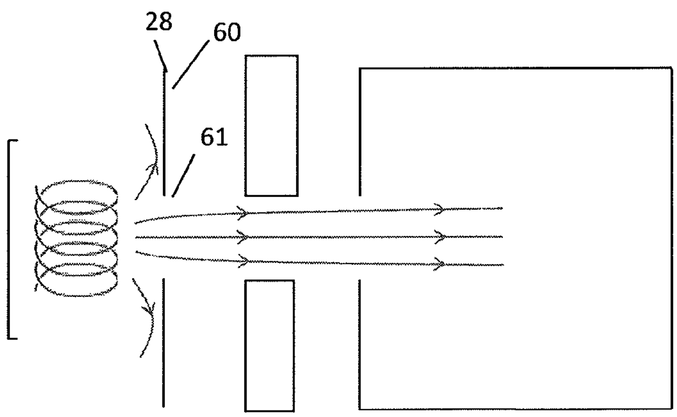
FIG. 4 shows the electron ionization apparatus of FIG. 3 further including a focusing lens according to an embodiment of the present invention.

In the embodiment shown in FIG. 4 the system further comprises a focusing lens 28 to focus the electron beam to increase electron density at the ion source chamber. The electron focusing lens 28 comprises a metallic plate 60 having a central aperture 61 formed therein. The aperture 61 is preferably of circular shape. The aperture 61 is located on the direct line of sight between the filament 22 and the opening 24 of the ion source chamber 18. The electron focusing lens 28 is arranged such that the plate 60 is substantially perpendicular to the path of the electron beam 34 with the aperture 61 being aligned with the path of the electron beam 34 such that electrons from the filament 22 travelling along the electron beam path 34 are permitted to pass through the aperture 61 and onwards to the ion chamber 18.

The plate 60 of the electron focusing lens 28 is biased to a negative voltage. The negative voltage bias of the plate 60 creates a repulsive electrostatic field that acts to condense and focus the cloud of electrons omitted from the filament 22 through the aperture 61 and along the electron beam path 34. In this way any broadening of the electron beam is countered by focusing the electrons using the electron focusing lens 28 and as a result the density of electrons along the electron path 34 is significantly increased. The number of electrons entering the ion chamber 18 is therefore increased and hence the probability of collision with analyte molecules resulting in ionization rises accordingly.

Figure 5:
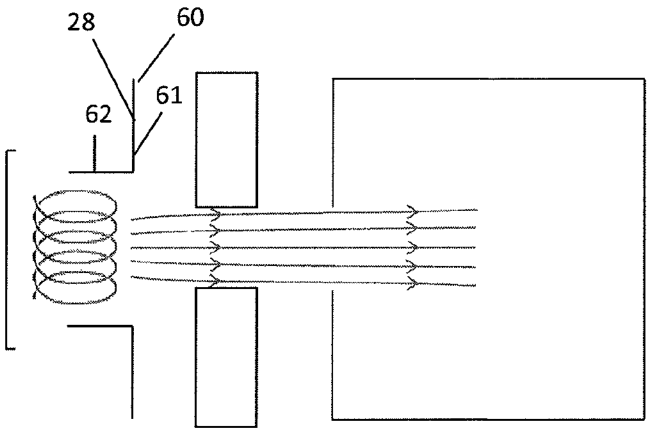
FIG. 5 shows the electron ionization apparatus of FIG. 3 including an alternative electron focusing lens according to a further embodiment of the present invention.

In a further embodiment shown in FIG. 5 the electron focusing lens 28 includes an additional focusing element 62. Preferably, the focusing element 62 comprises an upstanding wall circumferentially extending around the periphery of the aperture 61 and projecting from the surface of the disc 60 proximal to the filament 22. The focusing element 62 is substantially cylindrical in shape having its proximal end relative to the filament 22 open and its distal end contiguous with the aperture 61 of the lens 28. The focusing element 62 is preferably positioned such that it surrounds the filament 22 defining a channel surrounding the filament and extending between the filament 22 and the aperture 61 of the lens 28. In combination with the plate 60 the focusing element 62 forms a substantially 'top-hat' configuration. The top hat configuration enables the electron focusing lens 28 to be extended further towards and preferably over the filament 22. The 'top hat' shape increases funneling of the electrons and decreases the amount of time the electrons can propagate and tangentially diverge before being focused, thereby increasing electron density in the electron path 34. This is particularly important at the lower electron energies used in the present invention where electrons are subject to relatively higher tangential forces on generation and so their divergence is larger.

Figure 6:
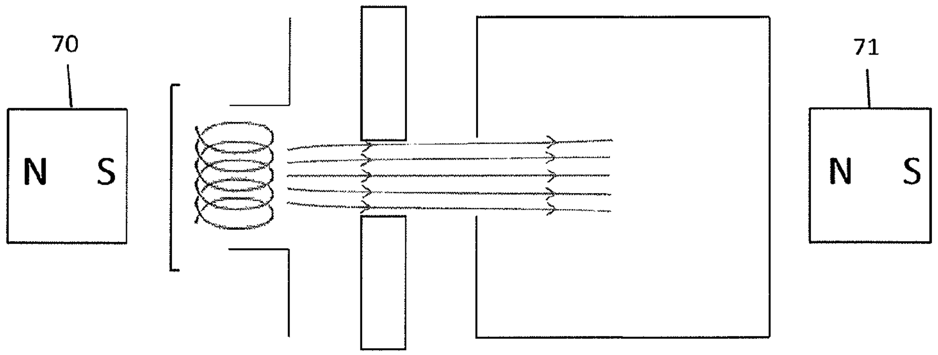
FIG. 6 shows the electron ionization apparatus of FIG. 5 including magnetic focusing elements.

In a further embodiment shown in FIG. 6 fixed magnets 70 and 71 are provided for the embodiments in FIGS. 3 to 5 with the poles arranged to create a magnetic field which acts on the electrons to focus them in a helical manner to further optimize ionization probability.

Figure 7:
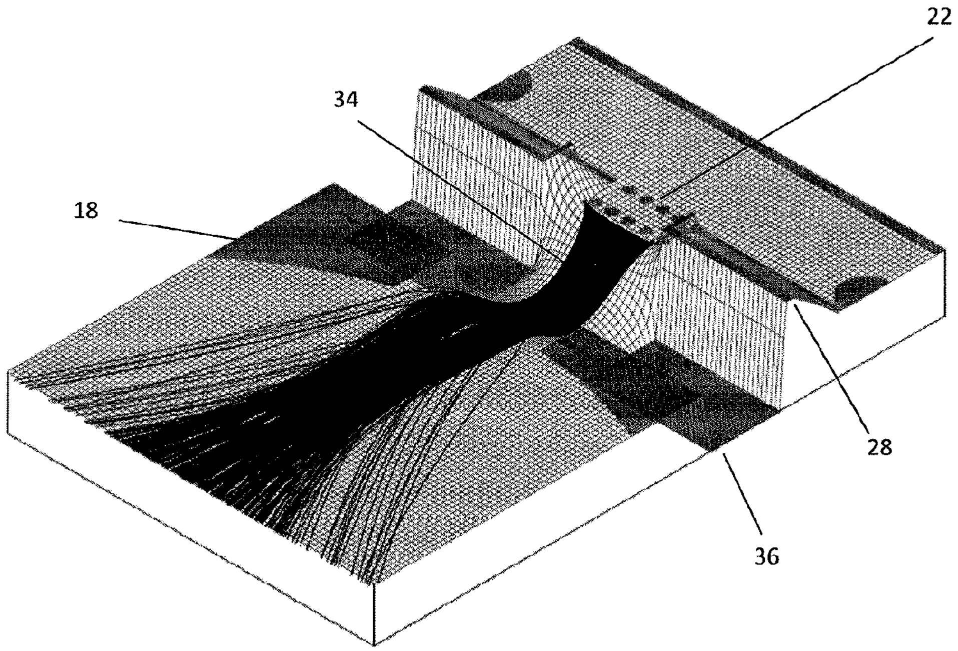
FIG. 7 is a field diagram showing the effects of the Electron focusing lens and extractor on electron velocity.

FIG. 7 shows an electrostatic field diagram representing the flow of electrons along the varying field between the filament and the ion source chamber. It can be seen that once the electrons are emitted from the filament 22 and have passed through the electron focusing lens 28 they accelerate rapidly towards the relatively positive potential difference of the extractor 36. This can be seen to cause a cascade of electrons away from the filament 22 thereby ensuring that the electron density immediately proximal to the filament 22 is maintained at suitably low levels promoting further electron production. Once the electron beam 34 passes through the extractor 36 it is subject to the potential difference between the extractor 36 and the ion chamber 18 which causes rapid deceleration of the electrons until they reach the set electron energy defined by the potential difference between filament and ion chamber 18 at the point of entering the ion chamber 18.

Therefore, the use of a positive potential between the electron focusing lens 28 and ion source chamber 18 in the form of an extractor 36 improves signal by reducing Coulombic effects and increasing the number of electrons produced by the filament. This gives improved instrument sensitivity at the lower ionization energies needed for soft ionization. The further embodiment in which the electron focusing lens 28 is wrapped around the filament by means of a focusing element 62 has been shown to bring further signal enhancements. In addition, by staying below the ionization energies of atmospheric gases, such as $N_2$, $O_2$, $CO_2$, $H_2O$, etc., this ionization method is suitable for real-time analysis (direct inlet of sample gas without GC separation), simplifying the necessary means for a direct inlet of atmospheric gases into the mass spectrometer. Furthermore, the above described soft electron ionization technique is a universal ionization method as compared for example to chemical ionization. Apart from the lower ionization energy it is non-specific to a large number of analytes. Therefore it is suitable for screening analysis with reduced background signal (e.g. suppressed ionization of siloxanes from column bleed or atmospheric gases, but ionization of all the relevant organic compounds).

The flexibility of electron ionization allows for the application of switching or multiplexing multiple ionizing voltages in one measurement. This gives the opportunity to simultaneously accumulate multiple sets of spectra, for example, one with hard ionization (e.g. 70 eV), and another with softer ionization (e.g. 15 eV). This could lead to increased levels of analytical information with little impact on cost, sensitivity, time, or the quantity of samples required.

For certain analysis it is desirable to be able to ionize the analyte molecules at two different ionization energies. For example, for a given sample it may be desirable to obtain a first 'soft ionization' data set and a second 'hard ionization' data set for a given analyte source, with the first data set benefiting from decreased fragmentation and hence increased visibility of the molecular ions, while the harder ionization provides increased ionization efficiency and is able to be referenced against established data libraries.

There are several possibilities to stop or modulate the intensity of the electron beam in an embodiment according to FIGS. 3-6. This can be achieved by changing the voltage of one of the following elements: reflector 26, filament 22, focusing lens 28, extractor 36 and ion chamber 18. It also can be done by introducing an additional shutter lens or grid in the pathway 34 of the electron beam. By way of example only this is described using the focusing lens 28 as a modulator or shutter.

In addition to focusing the electrons, the electron focusing lens 28 may also be configured to be used as a 'shutter' to selectively permit or block passage of the electron beam 34 to the ion chamber 18. By switching the electron focusing lens 28 to a different voltage it can be made to act as a 'gate', allowing or denying the electrons from reaching the ion source as required.

In an initial state the lens is set to 'pass' in which a first negative voltage is applied to the electron focusing lens 28. The first voltage is selected such that it is sufficiently negative to focus the electron beam while still allowing passage of the beam through the lens 28. The configuration of the central aperture of the lens 28 is such that the electrostatic field generated causes the electrons travelling towards the lens 28 to experience a repulsion force perpendicular to their movement towards the ion source chamber 18 which is directed radially inwards towards the aperture 61 of the lens 28. This field 'presses' the electrons into a narrow beam and directs them to pass through the lens 28. The compression of the electrons focuses them and increases the number of electrons that enter the ion source chamber 18. As such the efficiency and accuracy of ionization within the chamber 18 is increased.

In a second state the electron focusing lens 28 is set to 'stop' to prevent the flow of electrons to the ion source chamber 28. To set the lens 28 to stop a second negative voltage is applied to the electron focusing lens 28 that is greater (i.e. more negative) than the first voltage. Due to the larger negative repulsion voltage, approaching electrons are prevented from passing through the electron focusing lens 28 due to electron repulsion and instead dissipate. As such, the flow of the electron beam 34 through the lens 28 is stopped and hence the flow of electrons to the ion source chamber 18 is halted and further ion generation is stalled.

In one embodiment ion detection may be conducted on a cyclical basis through a series of 'scans'. Each scan is an individual data capture event commencing with the ionization of molecules within the target zone. The electron focusing lens 28 is then operated as a shutter to halt ionization and the ions are then extracted from the ion source 18 and propagated through the flight regions as described above. The scan concludes with the detection of the ions at the detector. The data acquisition frequency of the system is determined by the period of the scan. For example, for a scan period of around 100 μs the native data rate of the system will be approximately 10,000 Hz.

A relatively low quantity of ions is accumulated during a single scan, and as such any analysis based on a single scan alone would be subject to large statistical errors and would therefore be of limited use. It is also undesirable to acquire data from a single scan alone as the requirement to write data to a storage device for each scan period (i.e. every 100 μs) would result in extremely large and unmanageable file sizes. To avoid these problems the system sums the detected signals from multiple contiguous scans into scansets' with the accumulated signal being statistically more significant. Each scanset is then recorded as a single data point rather than multiple data points from each scan.

The number of scans that are summed to form a scanset may be selectively varied depending, for example, on chromatographic conditions. It has been found that it is preferable to acquire at least 5 data points for each GC peak, although the system may be operated below this parameter. Therefore, if the GC system typically gives peaks approximately 3 seconds wide and a data point value of 6 per peak is required, a 'scans per scanset' value of approximately 5000 would be set, which leads to a scanset every 5000*100 μs=0.5 s. This provides two data points a second which in turn gives around 6 data points for each peak. Therefore, following each scan the electron focusing lens 28 is re-opened to permit further ionization and the scan cycle continues.

This may be varied depending on the system, and for example in GC×GC systems the peaks are far narrower and so a much greater scanset rate is required. Here a scanset rate of up to around 100 Hz may be used, or one scanset every 0.01 s. At this speed a scanset is comprised of 100 scans.

Between the scans and also between the scansets a pause in the ionization may be provided by utilizing preferentially the electron focusing lens 28 as a shutter in the closed state in which ionization is halted. However, all other electrically chargeable elements in the pathway of the electron beam could also be used as a shutter: reflector, filament, focusing lens, extractor, and ionization chamber. Even a separate shutter element is conceivable. The duration of the pause between scans and between scansets can be different. The pause between scansets may be utilized to vary the electron ionization voltage before the next scanset is commenced. Voltages controlling the reflector plate 26, extractor 36 and electron focusing lens 28 could be adjusted within the scanset pause, with the scanset pause period being selected to ensure a sufficiently stable voltage establishes before recommencement of the next scanset and subsequent data collection. In one embodiment, as shown in FIG. 8, a first scanset may be conducted at an electron acceleration voltage of 15V. During the first scanset pause the accelerating voltage is then increased to 70V and the next scanset is then conducted at the elevated voltage. During the second scanset pause the voltage is then reduced to 15V and this cycle of raising and lowering the accelerating voltage is continued on an intermittent alternating basis.

The electron voltage may be effectively varied between scansets by varying the bias voltage of the filament 22 relative to the ion chamber 18 which defines the energy of the ionizing electrons. As the optimum voltages for the extractor and electron focusing lens 28 may vary with different ionization energies, it could also be necessary to change these values alongside the voltage of the filament 22.

By selectively varying the voltage of the filament between scansets between two or more voltage values, multiple ionization energies ($E_x$) may be applied in a single analytical experiment, rather than a given sample needing to be analyzed at one electron energy and a re-analysis being performed at a second or further electron energy. The rapid cyclical alternation of electron energies during a single sample analysis is enabled by the electron focusing lens 28 operating as a shutter halting ionization between the scans and scansets, providing the scanset pause, and by the extractor 36 which enables analytically viable measurements to be made at soft ionization energies by increasing electron density and hence ionization efficiency at these lower energies. While soft ionization may be conducted by alternative means, such as chemical ionization, and with reasonable efficiency, such techniques do not permit the ionization energy to be varied during an analysis run as this would require a substitution of the ionization gas which could not be effected in the required time periods. In addition, chemical ionization allows only certain discrete ionization energies, whereas the present invention permits any desired ionization energy to be achieved within the voltage parametric range of the device.

The alternation of the electron acceleration voltages between adjacent scansets supports the simultaneous production of two full sets of spectra; one ionized at $E_1$ and the other at $E_2$. However, it will be appreciated that the ability to selectively vary the ionization energy during an analysis could be applied in a variety of other ways. For example the ionization energy could be selectively varied at a given predetermined time during the measurement of a sample.

For an alternating two voltage analysis, it would be preferable to double the overall scanset rate to maintain the correct number of data points for each peak and ionization energy. In effect, the same number of detected ions would be 'shared' between both ionization energies. This would lead to each result having 50% of the intensities seen using one constant ionization energy. However, in many cases the benefits provided by the information from the second set of results would far outweigh the drawbacks from any decrease in sensitivity of each result.

It will be appreciated that while given electron energies are cited above by way of example, it is contemplated that the system could operate using any desired number of ionization energies during an analysis and in any given order or period during the analysis. For example, rather than sampling at $E_1$ and $E_2$ on a continually alternating basis, data could be collected with ionization energy $E_1$ concurrently with $E_2$ for the first section of a measurement, before moving on to collect with $E_1$ and $E_3$ for a later section. As such ionization may be achieved at any energy or set of energies, either simultaneously or sequentially within the same measurement. Combined with the ability to ionize at soft electron voltages a powerful and highly flexible tool is provided for the simultaneous accumulation of both hard and softly ionized sample data.

Space charge effects hinder electron production and so reduce ionization. The present invention negates or mitigates the effects of space charge limited emission by extracting the electron cloud with a high field. Subsequent to the extraction the electrons are automatically decelerated while approaching the ion chamber. This allows low electron energies in the target region while maintaining a high electron production at the emitter.

Whilst endeavoring in the foregoing specification to draw attention to those features of the invention believed to be of particular importance it should be understood that the Applicant claims protection in respect of any patentable feature or combination of features hereinbefore referred to and/or shown in the drawings whether or not particular emphasis has been placed thereon.

It will be appreciated that in further embodiments various modifications to the specific arrangements described above and shown in the drawings may be made. For example, while specific values of voltages and time periods are described above by way of example, which may be advantageous for the specific embodiments described, it will be appreciated that the invention is not limited to the application of these values which may be varied depending on the specific application of the invention. In addition, while a specific TOF system is described above by way of example, the system is not limited to use with such a system. Furthermore, it is emphasized that the ionization technique is not limited to use with TOF mass spectrometry and it is contemplated that this system could be utilized for any application requiring ionization of molecules and in particular where soft ionization is required and/or the ability to switch between ionization voltages within a single sample analysis.

What is claimed is:

1. A method of ionizing analyte molecules for analysis comprising:

supplying analyte molecules to a target volume;

accelerating a flow of electrons from an electron source to the target volume to cause ionization of the analyte molecules to generate analyte ions using a first ionization electron energy;

detecting the analyte ions generated by the first ionization electron energy;

changing the first ionization electron energy to a second ionization electron energy that is different to the first ionization electron energy to cause ionization and generate analyte ions using the second ionization electron energy; and detecting the analyte ions generated by the second ionization electron energy.

2. The method according to claim 1, wherein accelerating the flow of electrons comprises accelerating the flow of electrons from the electron source to an intermediate region at higher potential than the target volume to maintain the electron flux from the electron source, and wherein the method further comprises causing the electrons to enter the target volume at lower potential than the intermediate region to decelerate the electrons to a final ionization electron energy.

3. The method according to claim 1, wherein the analyte ions generated by the first ionization electron energy are generated during a first ionization period and the analyte ions generated using the second ionization electron energy are generated during a predetermined second ionization period.

4. The method according to claim 1, wherein the first ionization electron energy is 70 eV and the second ionization electron energy is in the range of 5-30 eV.

5. The method according to claim 3, wherein the analyte ions generated during the first ionization period are detected at the end of the first ionization period and the analyte ions generated during the second ionization period are detected at the end of the second ionization period.

6. The method according to claim 1, wherein the analyte ions generated by the first ionization electron energy are detected during a first ionization period.

7. The method according to claim 2, wherein the analyte ions generated by the first ionization electron energy are generated during a first ionization period and the analyte ions generated using the second ionization electron energy are generated during a second ionization period; and wherein the intermediate region is at a different potential during the first and second ionization periods.

8. The method according to claim 3, wherein an electron beam shutter is provided between the electron source and the target volume that is operable in a first pass state in which electrons are permitted to pass to the target volume and a stop state in which electrons are prevented from passing to the target volume, and wherein the shutter is operated in the stop state between the first and second ionization periods to discontinue electron flow.

9. The method according to claim 2, wherein an electron beam shutter is provided in the intermediate region.

10. The method according to claim 1, wherein ionizing the analyte molecules and detecting the analyte ions generated by the first ionization electron energy defines a first detection event, and wherein the method further comprises conducting a series of first detection events at the first ionization electron energy and cumulating the detection data from each first detection event into a first detection set comprising data from a predetermined number of first detection events and then transferring the first detection set data to a data storage device during a first data transfer period.

11. The method according to claim 1, wherein detecting the analyte ions comprises generating a mass spectrum.

12. The method according to claim 3, wherein the first ionization period and the second ionization period are of different duration.

13. The method according to claim 3, wherein the first ionization period and the second ionization period are of the same duration.

14. The method according to claim 3 further comprising:

discontinuing the flow of electrons to the target volume following the first ionization period;

changing the first ionization electron energy to a second ionization electron energy that is different to the first ionization electron energy while the flow of electrons is discontinued; and recommencing the flow of electrons to the target volume to cause ionization for the predetermined second ionization period using the second ionization electron energy.

15. The method according to claim 10, wherein ionizing the analyte ions and detecting the analyte ions generated by the second ionization electron energy defines a second detection event; and wherein the method further comprises conducting a series of second detection events at the second ionization electron energy and cumulating the detection data from each second detection event into a second detection set comprising data from a predetermined number of second detection events, until a predetermined number of first and second detections sets have been completed.

16. The method according to claim 15 further comprising cycling the series of first detection sets and second detections sets on an alternating basis.

17. The method according to claim 1, wherein a first mass spectrum is generated corresponding to the first ionization electron energy and a second mass spectrum is generated corresponding to the second ionization electron energy.

18. The method according to claim 15, wherein the second detection set is commenced following the first data transfer period, and wherein the ionization electron energy is changed from the first ionization electron energy to the second ionization electron energy after the first detection event.

19. The method according to claim 10, wherein the ionization electron energy is changed from the first ionization electron energy to the second ionization electron energy during the first data transfer period.

20. The method according to claim 11, wherein the analyte ions are detected using a mass spectrometer.

21. The method according to claim 1, wherein ionizing the analyte ions and detecting the analyte ions generated by the second ionization electron energy defines a second detection event, and wherein the method further comprises conducting a series of second detection events and cumulating the detection data from each second detection event into a second detection set comprising data from a predetermined number of second detection events and then transferring the second detection set data to a data storage device during a second data transfer period.

* * * * *